(12) United States Patent
Zhang et al.

(10) Patent No.: US 6,540,866 B1
(45) Date of Patent: *Apr. 1, 2003

(54) METHOD FOR LAMINATION OF FLUOROPOLYMER TO METAL AND PRINTED CIRCUIT BOARD (PCB) SUBSTRATE

(75) Inventors: Junfeng Zhang, Singapore (SG); Cheng Qiang Cui, Singapore (SG); Thiam Beng Lim, Singapore (SG); En-Tang Kang, Singapore (SG)

(73) Assignees: Institute of Microelectronics, Singapore (SG); National University of Singapore, Singapore (SG)

(*) Notice: Subject to any disclaimer, the term of this patent is extended or adjusted under 35 U.S.C. 154(b) by 165 days.

This patent is subject to a terminal disclaimer.

(21) Appl. No.: 09/604,959

(22) Filed: Jun. 28, 2000

(30) Foreign Application Priority Data

Jun. 29, 1999 (SG) ............................................. 9903216

(51) Int. Cl.[7] ............................................. B32B 31/12
(52) U.S. Cl. ............................... 156/272.6; 156/272.2; 156/308.6; 156/309.3; 427/536; 427/384
(58) Field of Search .......................... 156/272.2, 272.6, 156/273.3, 275.7, 308.6, 309.3; 428/420; 427/535, 536, 384

(56) References Cited

U.S. PATENT DOCUMENTS

| 4,506,035 A | | 3/1985 | Barnett et al. | |
| 4,640,866 A | | 2/1987 | Suzuki | |
| 4,743,327 A | * | 5/1988 | DeHaan et al. | 156/272.6 |
| 4,861,408 A | | 8/1989 | Kelber | |
| 4,895,756 A | | 1/1990 | Suzuki | |
| 4,911,771 A | | 3/1990 | Tanaka et al. | |
| 4,933,060 A | | 6/1990 | Okabayashi | |
| 4,996,097 A | | 2/1991 | Fischer | |
| 5,755,913 A | * | 5/1998 | Liaw et al. | 156/272.6 |
| 6,334,926 B1 | * | 1/2002 | Kang et al. | 156/272.2 |

FOREIGN PATENT DOCUMENTS

| CA | 2136897 | 6/1995 |
| EP | 0 160 418 A2 | 11/1985 |
| EP | 0 160 418 B1 | 11/1985 |
| EP | 0 160 439 B1 | 11/1985 |
| EP | 0 160 439 A2 | 11/1985 |
| EP | 0 331 429 A3 | 9/1989 |
| EP | 0 463 105 B1 | 1/1992 |
| EP | 0 650 987 A1 | 5/1995 |
| EP | 0 656 376 A1 | 6/1995 |
| JP | 53-121076 | 10/1978 |
| JP | 59-53542 A | 3/1984 |
| JP | 60-020941 A | 2/1985 |
| JP | 60-235844 A | 11/1985 |
| JP | 63-159441 A | 7/1988 |
| JP | 63-170992 A2 | 7/1988 |
| JP | 63-290735 A2 | 11/1988 |
| JP | 1-265886 A | 10/1989 |
| JP | 02-178028 A | 7/1990 |
| JP | 5-259635 A | 10/1993 |
| JP | 6-0026071 A | 2/1994 |
| JP | 6-206946 A | 7/1994 |
| JP | 1-170091 A | 12/1994 |
| JP | 7-025952 A | 1/1995 |
| JP | 7-149960 A | 6/1995 |
| JP | 7-186325 A | 7/1995 |
| WO | WO99/21706 A1 | 5/1999 |

OTHER PUBLICATIONS

Morton A. Golub et al., Langmuir, vol. 10, (1994), pp. 3629–3634.
K.L. Tan et al., Macromolecules, vol. 26, No. 11, (1993), pp. 2832–2836.
Tie Wang et al., J. Adhesion Sci., Technol., vol. 11, No. 5, (1997), pp. 679–693.
E.T. Kang et al., J. Adhesion Sci., Technol., vol. 10, No. 8, (1996), pp. 725–743.

* cited by examiner

Primary Examiner—Michael W. Ball
Assistant Examiner—John T. Haran
(74) Attorney, Agent, or Firm—Birch Stewart Kolasch & Birch LLP

(57) ABSTRACT

The present invention is directed to a method for the lamination of fluoropolymers to the surfaces of metals, and especially to copper, gold, and platinum, and to printed circuit board (PCB) substrate at temperatures substantially below the sintering temperatures or melting temperatures of the fluoropolymers. More specifically, the invention is directed to a method for surface modification of fluoropolymers by thermal graft copolymerization with concurrent lamination of metals in the presence of a functional monomer and an adhesive such as an epoxy resin. The process can be carried out under atmospheric conditions and in the complete absence of an added polymerization initiator. The laminated fluoropolymer-metal or fluoropolymer-PCB substrate interfaces exhibit T-peel strengths of no less than 8 N/cm. This invention can also be applied to substantially improve the adhesion between PCB substrates and metals.

15 Claims, No Drawings

METHOD FOR LAMINATION OF FLUOROPOLYMER TO METAL AND PRINTED CIRCUIT BOARD (PCB) SUBSTRATE

BACKGROUND OF THE INVENTION

1. Field of the Invention

This invention relates to a method for the low temperature lamination of inert fluoropolymers to the surfaces of metals and printed circuit board (PCB) substrate.

When thermal grafting or graft copolymerization is carried out on the plasma pre-activated surface and interface of a fluoropolymer in contact with a metal surface in the presence of an adhesive, lamination occurs simultaneously. The graft polymerized layer can concurrently interact with the adhesive layer by crosslinking or other chemical or physical interactions, resulting in strong interfacial adhesion strength. The surface graft copolymerization with lamination of the metal is carried out under atmosphere conditions, and in the complete absence of any added polymerization initiator or system degassing.

Functional monomers used for thermal grafting or graft copolymerization with concurrent lamination include, but not limited to, epoxide containing monomers, hydroxy-containing monomers, amine-containing monomers, monomers of polyelectrolyte and monomers of polyampholyte. The adhesives used for lamination are mainly from the epoxy resin families.

The lap shear adhesion strength can readily exceed the tensile yield strength of the substrate polymer film. The lap T-peel adhesion strengths of the so laminated fluoropolymer-metal interfaces or fluoropolymer-PCB substrate interfaces are in excess of 8 N/cm, with delamination occurring in the bulk of substrate polymer film via cohesive failure. The strong adhesion between the fluoropolymer and the metal or PCB substrate is due to, on the one hand, the formation of covalent bonding of the grafted functional chains on the polymer surface, and on the other hand, the crosslinking or other strong interactions of these grafted chains to epoxy resin adhesive, which has strong adhesion towards metals and PCB substrate surfaces. The present invention distinguishes itself from the prior art in that the grafting/lamination process is carried out at temperatures substantially below the melting processing or sintering temperatures of fluoropolymer and that the adhesion strengths are higher than those in which only adhesive is used.

2. Description of Related Art

Fluoropolymers in general, and polytetrafluoroethylene (PTFE) in particular, are excellent candidates for dielectric materials in the application of packaging of microelectronics. They are chemically inert and they also have good thermal stability. With improved adhesion between a fluoropolymer and a metal or PCB substrate, the application of fluoropolymers in multi-chip module(MCM) packaging, for example, may become a reality. However, the physical and chemical inertness associated with most of the fluoropolymer dictates the use of more drastic means for achieving the required surface modifications. The strategies of surface chemical and physical modification have been widely implemented for fluoropolymers and hydrocarbon polymers alike.

One of the major drawbacks of the most commonly utilized technique of plasma treatment is that the physico-chemical characteristics of the modified polymer surfaces, including surface compositions, are time-dependent. Chain and polar group reorientation in the surface region can result in gradual deterioration of the surface reactivity. Furthermore, anomalous changes in oxygen and fluorine contents, and therefore also surface compositions, may result from the presence of surface hydrocarbon contamination during plasma treatment, as suggested by M. A. Golub, E. S. Lopata, L. S. Finney, *Langmuir*, 10, 3629 (1994). To overcome the time-dependent surface characteristics, the plasma-treated fluoropolymers have been subjected to further surface modification via graft copolymerization, as shown in K. L. Tan, L. L. Woon, H. K. Wong, E. T. Kang and K. G. Neoh, *Macromolecules*, 26, 2832 (1993); E. T. Kang, K. G. Neoh, W. Chen, K. L. Tan, C. C. Huang and D. J. Liaw, *J. Adhesion Sci. Technol.*, 10, 725 (1996); and Tie Wang, E. T. Kang, K, G, Neoh, K. L. Tan, C. Q. Cui and T. B. Lim, *J. Adhesion Sci. Tech.*, 11, 679 (1997).

The patent literature contains numerous disclosures of surface modification of fluoropolymers for adhesion enhancement. However, most of the cases are related to plasma or chemical surface treatment. A few cases are related to surface modification via graft copolymerization. Almost no case study is directly related to the modification of fluoropolymer via surface graft copolymerizaiton for the improvement of adhesion between two fluoropolymer surfaces, between a fluoropolymer surface and a conjugated polymer surface, or between a fluoropolymer surface and a metal surface. Throughout our exhaustive patent literature search, there is no relevant process which involves the simultaneous modification of a fluoropolymer surface via grafting or graft copolymerization and the concurrent lamination of a metal in the presence of an adhesive. Almost no case study is directly related to surface graft copolymerization for adhesive enhancement.

For further background reading, reference is made to the following patent publications relating to surface modifications via grafting, and surface modifications for adhesion improvement:

Japanese Patent Publication Nos. 60,026,071A; 6,206,946A; 7,025,952A; 7,149,960; 7,186,325A, 60,020,941A; 92,004,353B; 1,265,886A, 7,186,325A; U.S. Pat. No. 4,506,035; Canadian Patent No. 2,136,897 and European Patent No. 656376.

For patent literature dealing with fluoropolymer-metal laminates, reference is made to the following patent publications:

U.S. Pat. Nos. 4,640,866; 4,861,408; 4,911,771; 4,996,097; 4,933,060 and 7,036,039.

European Patent Publication Nos. 160,418A; 160,439A; 160,439B; 331,429A and 463,105A.

Japanese Patent Publication Nos. 2,178,028; 5,259,635A2 and 63,170,992.

SUMMARY OF THE INVENTION

It is an object of the present invention to provide a new method for the direct lamination of fluoropolymers to metal and PCB substrate surfaces, as well as metal to PCB substrate surfaces, under atmospheric condition for microelectronic applications.

It is also an object of the present invention to improve the adhesion and affect the lamination in a simple process.

These and other objects and advantages of the present invention are obtained by providing a method for the modification of fluoropolymer via, first plasma pretreatment, followed by thermal graft copolymerization of an appropriate functional monomer and curing together with an adhesive or adhesives at the lapped interface between the fluoroppolymer and the selected metals or PCB substrate.

A desirable low grafting/lamination temperature is selected to be substantially below the melting or sintering temperatures of the fluoropolymer. Desirable radio frequency argon plasma with low plasma power is selected for the pretreatment of the fluoropolymer to minimize the undesirable overoxidation, etching or sputtering of the fluoropolymer surface.

The objects and advantages of the present invention can be achieved when the monomer used for surface graft copolymerization with concurrent lamination are selected from a group of vinyl monomers which contain epoxide or amine functionalities in the pendant group or groups, which can cure with the applied adhesive or adhesives to form a crosslinking network.

The objects and advantages of the present invention can be achieved when a pure monomer is used for graft copolymerization.

The objects and advantages of the present invention can be achieved on virtually all fluoropolymer substrates. The objects and advantage are realized on fluoropolymer substrates, such as, but not limited to, poly(tetrafluoroethylene) (PTFE) and its derivatives, composites and copolymers, including the particulate or fiber reinforced fluoropolymer composites, copolymer of tetrafluoroethylene and hexafluoro(propyl vinyl ether), copolymers of tetrafluoroethylene and perfluoro-2,2-dimethyl-1,3-dioxole, and copolymers of tetrafluoroethylene and vinyl fouoride, poly(vinyl fluoride), poly(vinylidene fluoride), polychlorotrifluoroethylene, vinyl floride/vinylidene fluoride copolymer, and vinylidene fluoride/hexafluoroethylene copolymer.

The objects and advantages of the present invention are obtained when the selected metals for lamination are aluminum, copper, gold, platinum, and their alloys.

DESCRIPTION OF PREFERRED EMBODIMENTS

It is widely accepted that formation of covalent bonds between the polymer surface and the resin matrix can enhance the interfacial adhesion. The present invention is based on the fact that functional groups of the covalently tethered polymer chains on the fluoropolymer surface interact through chemical reactions, ionic interactions, or other chemical and physical interactions with the adhesive resins which have strong adhesion towards contacting metal surface to result in strong adhesion between the fluoropolymer and metal. The lamination temperature in the present invention is thus governed by the optimum temperature for surface graft copolymerization and curing of adhesive. This temperature is substantially below the melting point or the sintering temperature of the fluoropolymer.

In the preferred method, the argon plasma pretreated fluoropolymer surfaces are subjected to thermally induced graft copolymerization with reactive vinyl monomers containing the epoxide, amine, cationic, anionic or amphoteric functional groups. The plasma pretreatment are carefully controlled to introduce peroxide and hydroxyl peroxide species on the fluoropolymer surfaces to initiate the subsequent surface graft copolymerization, resulting in covalently tethered functional polymer chains on the fluoropolymer surface. When the surface graft copolymerization is carried out and the functional groups of the grafted chains are capable of forming strong interaction with adhesives of metal, strong adhesion of the metal to the fluoropolymer surface is achieved. Furthermore, the simultaneous grafting and lamination process at the polymer-metal interface is affected by thermal decomposition of the peroxides and hydroxyl peroxides at the fluoropolymer surface. The process can be carried out near the peroxide decomposition temperature and adhesive curing temperature which are usually less than 150° C. and under atmospheric conditions in the complete absence of an added polymerization initiator. The joint delaminates by cohesive failure inside the fluoropolymer.

The preferred application and the best advantages of the present invention are obtained from fluoropolymer films, thin sheets or plates, as well as from metal foils, films, thin sheets or plates. Thus, in the preferred method, the surface of the fluoropolymer is first pretreated with radio frequency gas plasma. The selections of plasma type, plasma power and duration for pretreatment are important. High plasma power and long pretreatment time can result in excessive etching of the polymer surface, in surface crosslinking, and in dehalogenation of the polymer sample. The preferred range of plasma power range of treatment time is typically from 10 W to 50 W. The preferred range of treatment time is typically from 5 s to 120 s, and the preferred frequency is typically in the range of 5 kHz to 50 kHz.

Monomers for the simultaneous graft copolymerization and lamination process are selected from a group of vinyl monomers which readily undergo free-radical initiated polymerization. Desirably, the monomers are selected from the family containing the epoxide, amine, anionic, cationic or amphoteric functional groups.

EXAMPLES

The following specific examples are provided to illustrate this invention and the manner in which it may be carried out. It will be understood, however, that the specific details given in each example have been selected for purpose of illustration and are not be constructed as a limitation on the invention. Example 1 provides more details on the conduct of the simultaneous surface graft copolymerization and lamination experiment in the presence of a functional monomer and an epoxy adhesive.

Example 1

In a preferred experimental scale process, a poly(tetrafluoroethylene) (PTFE) film of size 0.5 cm×2.0 cm with a thickness of 0.1 mm was pretreated with Ar plasma for 80 seconds. Then glycidyl methacrylate (GMA) monomer was introduced onto the film and spread to form a thin liquid layer on the film surface. The film coated with GMA monomer was lapped with a 0.1 mm thick copper foil of similar size in the presence of a bisphenol A type epoxy resin (poly(bisphenol A-co-epichlorohydrin), to which a amine hardener (hexanethylenediamine) was added in the proportion of 100:25 (epoxy: hardener, by weight). The lapped area was kept at 0.5 cm×1.0 cm. The surface of the copper metal was cleaned by washing with acetone, 1.0 N HCl, and double distilled water, respectively, before use. The PTFE/GMA-epoxy resin/Cu assembly was sandwiched between two slide glass on which an equivalent pressure of about 10 N/cm$^2$ was provided. The assembly under pressure was subjected to thermal graft copolymerization, curing, and lamination at 130° C. for 5 hours in a constant temperature oven. After the grafting and lamination process, the assembly was allowed to return to room temperature slowly in the well-insulated oven over a period of no less than 6 h. The PTFE-Cu joint so prepared exhibited a T-peel strength exceeding 8 N/cm.

Example 2

In a preferred lamination experiment, an Ar plasma pretreated PTFE surface was coated with a thin layer of dimethylamino ethylmethacrylate (DMAEMA) monomer. Then the film was lapped with a copper foil of similar size in the presence of an epoxy resin, containing an amine hardener. The PTFE/DMAEMA-epoxy resin/Cu assembly was subjected to the thermal graft copolymerization and curing with concurrent lamination process at 130° C. under load for 5 h. The assembly was cooled by annealing in a well-insulated oven. The PTFE-Cu joint so-prepared exhibited a T-peel strength of no less than 7 N/cm.

Example 3

In a preferred lamination experiment, an Ar plasma pretreated PTFE surface was coated with a thin layer of glycidyl methacrylate (GMA) monomer. The film was lapped with a PCB substrate (e.g. FR4®, a composite of epoxy resin and glass fiber) of similar size in the presence of an epoxy resin containing an amine hardener. The PTFE/GMA-epoxy resin/PCB substrate assembly was subjected to the thermal graft copolymerization and curing with concurrent lamination process at 130° C. under load for 5 h. The assembly was cooled by annealing in a well-insulated oven. The PTFE-PCB substrate joint so-prepared exhibited a T-peel strength of no less than 10 N/cm.

Example 4

In a preferred lamination experiment, an Ar plasma pretreated PTFE surface was coated with a thin layer of glycidyl methacrylate (GMA) monomer. Then the film was lapped with a 0.1 mm thick aluminum foil of similar size in the presence of an epoxy resin, to which amine hardener was added. The PTFE/GMA-epoxy resin/Al assembly was subjected to the thermal graft copolymerization and curing with concurrent lamination process at 130° C. under load for 5 h. The assembly was cooled by annealing in a well-insulated oven. The PTFE-Al joint so-prepared exhibited a T-peel strength of no less than 8 N/cm.

Example 5

In another preferred lamination experiment, an Ar plasma pretreated PTFE surface was coated with a thin layer of glycidyl methacrylate (GMA) monomer. A single crystal silicon wafer was coated with gold by sputtering. Then the film was lapped with gold coated silicon wafer in the presence of an epoxy resin, to which amine hardener was added. The PTFE/GMA-epoxy resin/Au assembly was subjected to the thermal graft copolymerization and curing with concurrent lamination process at 130° C. under load for 5 h. The assembly was cooled by annealing in a well-insulated oven. The PTFE-Au joint so-prepared exhibited a T-peel strength of no less than 8 N/cm.

Example 6

In a preferred lamination experiment, an Ar plasma pretreated PTFE surface was coated with a thin layer of glycidyl methacrylate (GMA) monomer. Then the film was lapped with a 0.025 mm thick platinum of similar size in the presence of an epoxy resin containing an amine hardener. The PTFE/GMA-epoxy resin/Pt assembly was subjected to the thermal graft copolymerization and curing with concurrent lamination process at 130° C. under load for 5 h. The assembly was cooled by annealing in a well-insulated oven. The PTFE-Pt joint so-prepared exhibited a T-peel strength of no less than 5 N/cm.

Example 7

In a preferred lamination experiment, an Ar plasma pretreated epoxy-based FR4® substrate surface was immersed in a 20 wt % dioxane solution of GMA and irradiated with UV from a high pressure mercury lamp for 1 hr. After UV irradiation the FR4® was washed thoroughly with acetone and dried under reduced pressure. The GMA graft copolymerized FR4® surface was then lapped with a 0.1 mm thick copper foil of similar size in the presence of an epoxy resin, which contains an amine hardener. The FR4®/GMA-epoxy resin/Cu assembly was subjected to the curing with concurrent lamination process at 150° C. under load for 3 h. The assembly was cooled by annealing in a well-insulated oven. The FR4®-Cu joint so-prepared exhibited a T-peel strength of no less than 31 N/cm.

To those skilled in the art to which this invention relates, many changes in construction and widely differing embodiments and applications of the invention will suggest themselves without departing from the spirit and scope of the invention. The disclosures and the descriptions herein are purely illustrative and are not intended to be in any sense limiting.

What is claimed is:

1. A method for lamination of fluoropolymers to metal and/or to printed circuit board substrate surfaces, comprising:
    i) pretreating the fluoropolymer with a plasma;
    ii) thermal graft co-polymerizing at least one functional monomer to obtain a grafted fluoropolymer; and
    iii) applying at least one adhesive at a lapped interface between the metal and/or printed circuit board substrate and the grafted fluoropolymer and curing the at least one adhesive to laminate the metal and or printed circuit board substrate to the grafted fluoropolymer;
wherein steps i) through iii) are performed at a temperature below the melting point or sintering temperature of the fluoropolymer.

2. The method of claim 1, in which step i) is performed using a low power radio frequency argon plasma.

3. The method of claim 2, wherein the plasma power ranges from 10 to 50 W.

4. The method of claim 1, in which the lamination is accomplished simultaneously with the thermal graft co-polymerization by performing the thermal graft polymerization while the pretreated fluoropolymer is in contact with the metal or printed circuit board substrate.

5. The method of claim 4, in which the graft polymerizing step is performed under atmospheric conditions and in the absence of any added polymerization inhibitor.

6. The method of claim 1, in which the lamination is accomplished after the thermal graft co-polymerization.

7. The method of claim 1, in which the fluoropolymer is in the form of a film, sheet, slab, fiber, rod, powder or porous membrane.

8. The method of claim 1, in which a metal in the form of a film, sheet, slab, fiber, rod, powder or porous membrane is laminated.

9. The method of any one of claims 1–6, in which the fluoropolymer is selected from the group consisting of poly(tetrafluoroethylene), derivatives of poly(tetrafluoroethylene), copolymers of tetrafluoroethylene and hexafluoropropylene, copolymers of tetrafluoroethylene and perfluoro(propyl vinyl ether), copolymers of tetrafluoroethylene and perfluoro-2,2-dimethyl-1,3-dioxole, copolymers of tetrafluoroethylene and vinyl fluoride, poly(vinyl fluoride), poly(vinylidene fluoride), polychlorotrifluoroethylene, vinyl fluoride/vinylidene fluoride copolymers, and vinylidenefluoride/hexafluoroethylene copolymers.

10. The method of any one of claims 1–6, in which the metal is selected from the group consisting of copper, a copper alloy, gold, a gold alloy, aluminum, an aluminum alloy, platinum and a platinum alloy.

11. The method of any one of claims 1–6, in which the substrate is a printed circuit board comprising an epoxy resin or a glass fiber composite.

12. The method of claim 1, in which the monomer in step ii) is a vinyl monomer comprising an epoxide or amine functionality in at least one pendant group, which can cure with the applied adhesive to form a cross-linking network.

13. The method of claim 1, in which the monomer in step ii) is selected from the group consisting of glycidyl methacrylate, allyl glycidyl ether, and dimethylamino ethylmethacrylate.

14. The method of claim 1, in which the adhesive comprises an epoxy polymer and a suitable curing agent.

15. The method of claim 1, in which the polymer is a composite that is a fiber, fabric or particulate reinforced composite.

* * * * *